(12) United States Patent
Navarro et al.

(10) Patent No.: US 11,800,820 B2
(45) Date of Patent: Oct. 24, 2023

(54) METHOD FOR PROGRAMMING A PHASE CHANGE MEMORY

(71) Applicant: Commissariat à l'Énergie Atomique et aux Énergies Alternatives, Paris (FR)

(72) Inventors: Gabriele Navarro, Grenoble (FR); Anna-Lisa Serra, Grenoble (FR); Guillaume Bourgeois, Grenoble (FR); Chiara Sabbione, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 158 days.

(21) Appl. No.: 17/531,896

(22) Filed: Nov. 22, 2021

(65) Prior Publication Data

US 2022/0165946 A1    May 26, 2022

(30) Foreign Application Priority Data

Nov. 23, 2020   (FR) ...................................... 2012028

(51) Int. Cl.
*G11C 11/00* (2006.01)
*H10N 70/20* (2023.01)
*H10N 70/00* (2023.01)
*G11C 13/00* (2006.01)

(52) U.S. Cl.
CPC ......... *H10N 70/231* (2023.02); *H10N 70/821* (2023.02); *G11C 13/0004* (2013.01)

(58) Field of Classification Search
CPC . G11C 13/0004; H10N 70/831; H10N 70/821

USPC ........................................................ 365/163
See application file for complete search history.

(56) References Cited

U.S. PATENT DOCUMENTS

| 7,348,268 | B2 |  | 3/2008 | Dennison |
| 8,634,235 | B2 |  | 1/2014 | Lung et al. |
| 9,501,042 | B1 | * | 11/2016 | Lee .......................... G04F 10/10 |
| 2008/0280411 | A1 | * | 11/2008 | Chang ................ H10N 70/8413 438/257 |
| 2010/0097851 | A1 |  | 4/2010 | Lee et al. |

OTHER PUBLICATIONS

Preliminary Search Report for French Application No. 2012028, dated Jul. 8, 2021.

(Continued)

*Primary Examiner* — Vu A Le
(74) *Attorney, Agent, or Firm* — Wolf, Greenfield & Sacks, P.C.

(57) ABSTRACT

A method for programming a phase change memory including a first layer of a phase change material capable of switching between a crystalline and an amorphous state and vice versa, the method including applying a programming current through the first layer so that an evolution of the areal density of this current as a function of time t decreases from a first level, between a first time and a second time, following a first evolution in time respecting, or being close to $$J_0(t) = \frac{K}{\sqrt{t}}$$

where K is a constant.

17 Claims, 5 Drawing Sheets

(56) References Cited

OTHER PUBLICATIONS

Hubert et al., Detailed Analysis of the Role of Thin-$HfO_2$ Interfacial Layer in $Ge_2Sb_2Te_5$-Based PCM. IEEE Transactions on Electron Devices. Jul. 11, 2013;60(7):2268-75.

* cited by examiner

METHOD FOR PROGRAMMING A PHASE CHANGE MEMORY

CROSS-REFERENCE TO RELATED APPLICATIONS

This application claims priority to French application number 2012028, filed Nov. 23, 2020. The contents of which is incorporated herein by reference in its entirety.

TECHNICAL FIELD

The present invention relates generally to non-volatile memories, more precisely to phase change memories (PCM) and more particularly to the method for programming the memory.

BACKGROUND ART

Phase change memories or PCMs are non-volatile memories based on the properties of phase change materials. Phase change materials have the ability to switch from a low resistive state to a resistive state as a result of heating. Phase change memories take advantage of the fact that the electrical resistance of the different states of the phase change materials is different in order to store data.

Programming of phase change memories is generally time consuming, so it would be desirable to reduce this programming time in order to increase the programming speed.

SUMMARY OF INVENTION

There is a need for improved data writing methods for phase change memories.

One embodiment addresses all or some of the drawbacks of known methods.

One embodiment provides a method for programming a phase change memory comprising a first layer of a phase change material capable of switching between a crystalline state and an amorphous state and vice versa, the method comprising the application of a programming current through the first layer such that an evolution of the areal current density as a function of time t decreases from a first level, between a first time instant and a second time instant, following a first evolution in time respecting, or being close to, $$J_0(t) = \frac{K}{\sqrt{t}}$$

where K is a constant.

According to one embodiment, the first evolution is close to $$J_0(t) = \frac{K}{\sqrt{t}}$$

if it creates, when superimposed thereon, one or more surfaces between the first evolution and $$J_0(t) = \frac{K}{\sqrt{t}},$$

and the ratio of the area of each surface to the integral of $$J_0(t) = \frac{K}{\sqrt{t}}$$

between the first and the second time instants is less than 0.2.

According to one embodiment, the first evolution intersects $$J_0(t) = \frac{K}{\sqrt{t}}$$

at least at two points between the first and second time instants.

According to one embodiment, prior to the first instant, the evolution of the areal current density as a function of time t, follows a second linear increasing evolution between a third time instant and a fourth time instant and then a third constant evolution equal to the first level between the fourth time instant and the first time instant.

According to one embodiment, the first evolution comprises several strictly decreasing linear portions and/or of constant proportions, between the first time instant and the second time instant.

According to one embodiment, the first layer rests on a heating element or an electrode.

According to one embodiment, the first layer rests on a second layer based on germanium nitride.

According to one embodiment, the programming current is applied through the first layer and a channel in the second layer, a contact zone between the channel and the lower face of the first layer having a smaller area than the lower face of the first layer.

According to one embodiment, the channel is a confined zone of a phase change material and is located in a filament of the second layer, the method comprising, after the second time instant, a step of crystallizing the confined zone.

According to one embodiment, a crystallization of the confined zone is brought about by a fourth constant linear evolution of the current density as a function of time, over a first duration and wherein the first duration is equal to $$t_{filament} = \frac{h_{filament}}{v_g}$$

with $h_{filament}$ the average height of the confined zone and with $v_g$ the crystallization rate of the phase change material.

According to one embodiment, the crystallization of the confined zone is brought about by a strictly decreasing linear evolution of the current density with time.

According to one embodiment, $$K = \frac{1}{\sqrt{H}} \text{ where } H = \frac{v_g \cdot R_{th} \cdot A^2 \cdot R_h}{h \cdot (T_{melt} - T_h)}$$

with $R_{th}$ the thermal resistance of the cell, $R_h$ the electrical resistance of the phase change material in the filament, A the area of the contact zone between the filament and the lower face of the first layer, h the maximum height of the phase change material, $T_{melt}$ the melting temperature of the phase change material, and with $T_h$ the temperature of the first layer of its upper side, i.e., the side opposite the lower face.

According to one embodiment, $$K = \frac{1}{\sqrt{H'}} \text{ where } H' = \frac{v_g \cdot R_{th} \cdot A^2 \cdot R'_h}{h \cdot (T_{melt} - T_h)}$$

with $R_{th}$ the thermal resistance of the cell, $R'_h$ the electrical resistance of the heating element, A the area of the contact zone between the electrode or the heating element and the lower face of the first layer, h the maximum height of the phase change material, $T_{melt}$ the melting temperature of the phase change material, and with $T_h$ the temperature of the first layer of its upper side, i.e., at the side opposite the lower face.

According to one embodiment, the duration between the first and second time instants, is equal to a second duration $$t_{dôme} = \frac{h \cdot (T_{melt} - T_h)}{v_g \cdot T_{melt}}.$$

According to one embodiment, the duration between the first and second time instants is between 1 ns and 1 µs.

According to one embodiment, the first level is a maximum current density level that the cell reaches during the programming cycles.

According to one embodiment, the application of the programming current corresponds to a crystallization of a portion of the first layer.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, as orientated during normal use.

Unless specified otherwise, the expressions "around", "approximately", "substantially" and "in the order of" signify within 10%, and preferably within 5%.

Figure 1:
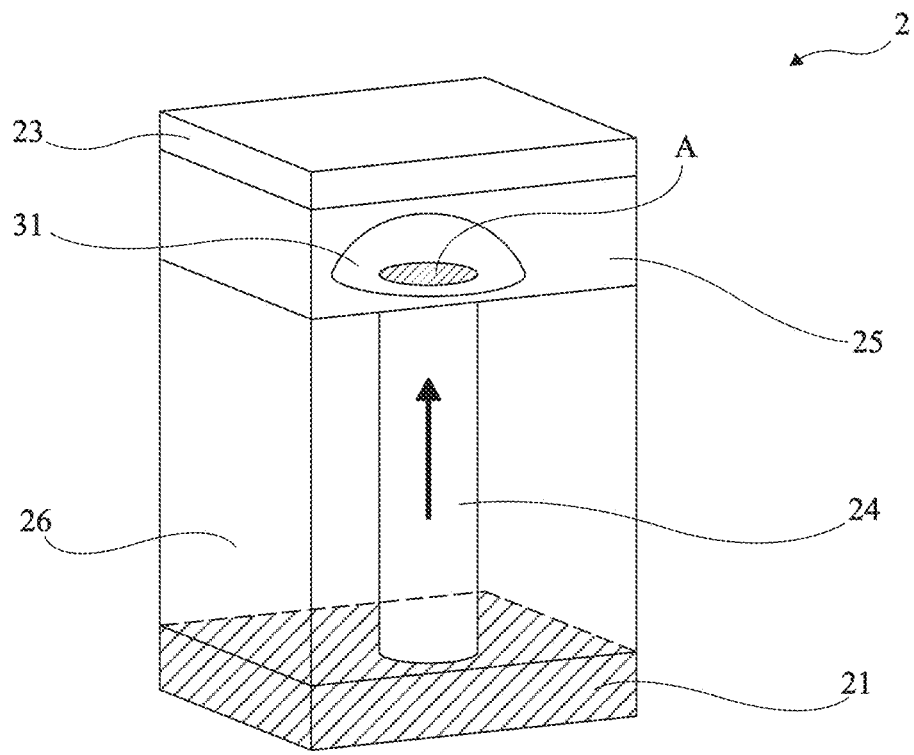
FIG. 1 represents, in a partial and perspective schematic view, a phase change memory device.

FIG. 1 represents a partial and perspective schematic view of a phase change memory device 2.

More particularly, FIG. 1 represents a phase change memory device 2 comprising a first electrode 23, which corresponds for example to a high electrode, a layer 25 of a phase change material and a second electrode 21, which corresponds for example to a low electrode.

Both electrodes 23 and 21 are, for example, metallic.

The phase change material is, for example, a GST material, i.e. a material composed of germanium (Ge), antimony (Sb) and tellurium (Te).

The device 2 further comprises a heating element (heater) 24 between the second electrode 21 and the layer 25 of the phase change material.

The heater 24 is, for example, made of tungsten or a titanium or tantalum based alloy.

The phase change material has the ability to switch from a High Resistive State (HRS) to a Low Resistive State (LRS) under the effect of heat and the Joule effect generated by the application of a current between the electrodes 21 and 23. Switching from a resistive state to a low resistive state corresponds to an activation operation, known as SET, i.e., an operation of writing a binary data value, for example, a logic value "1", and switching from a low resistive state to a resistive state corresponds to a deactivation operation, known as RESET, i.e., an operation of writing an opposite binary data value, for example, a logic value "0".

In the present description, the so-called "resistive" state may, by way of example, be an amorphous state, i.e., a disordered state having a high electrical resistance, and the so-called "less resistive" or "low resistive" state may, by way of example, be a crystalline or partially crystalline state, i.e., an ordered state having a lower electrical resistance.

Figure 2:
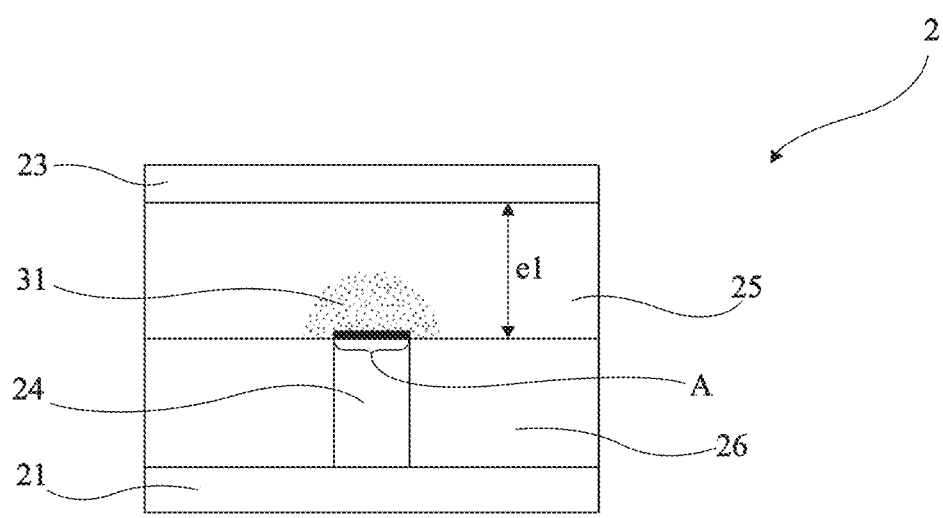
FIG. 2 represents, in a partial, schematic cross-sectional view, the phase change device of FIG. 1.

According to the embodiment illustrated in FIG. 2, the volume of the layer 25 affected by the phase changes corresponds, for example, to a dome 31. In the example in FIG. 1, the heating element 24 presents a cylinder shape. In one variant, the heating element 24 presents a shape of a right parallelepiped. The heating element is, for example, surrounded by an insulator 26, typically $SiO_2$, so as to increase the thermal resistance of the device and prevent heat dissipation through the edges of the heating element 24.

FIG. 2 is a partial, schematic cross-sectional view of the device 2, with the cross-section through the heating element 24.

The upper surface of the heating element 24 presents an area less than the area of the lower surface of the layer 25.

The layer 25 presents, for example, a thickness e1 between 10 nm and 200 nm and equal to, for example, about 50 nm. The layer 25 presents, for example, a width between 3 nm and 500 nm and equal to, for example, about 50 nm.

In FIG. 2, the heating element 24 has been represented as a layer. However, in other embodiments, it may have any shape, for example, the shape of an "L".

According to an alternative embodiment of FIG. 2, the device 2 does not include a lower electrode 21 and the heating element 24 acts as the electrode or vice versa.

Figure 3:
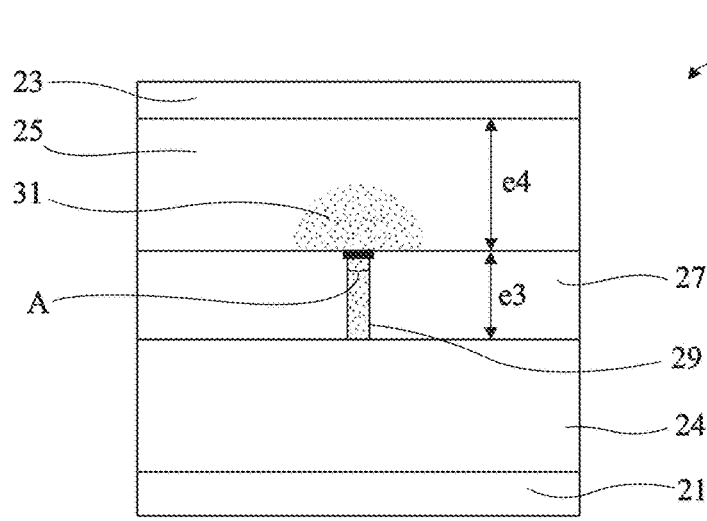
FIG. 3 represents in a partial, schematic cross-sectional view of another embodiment of a phase change device.

FIG. 3 is a partial, schematic cross-sectional view of an alternative embodiment of the device 2 illustrated in FIG. 2.

More particularly, FIG. 3 illustrates a device 3 similar to the device 2 illustrated in FIG. 2 except that the device 3 comprises a layer 27, between the layer 25 and the lower electrode 21.

The layer 27 is located, for example, on and in contact with the heating element 24 and the layer 25 is located between the layer 27 and the electrode 23.

According to one embodiment, the layer 27 is composed of a germanium nitride (GeN) material or a dielectric material. A filament is created in the layer 27 by a so-called breakdown phenomenon. The filament extends, for example, from the lower face of the layer 27 to the upper face of layer 27. The layer 27 is, for example, composed only of germanium nitride. The filament is created during a step, at the beginning of the life of the device 3, called "forming", during which a voltage is applied to the device 3. As soon as this voltage reaches a breaking voltage, the filament is created in the layer 27. During the forming process, the current is less than a limit value at which the materials in layers 25 and 27 liquefy and fuse.

The percentage of nitrogen in the layer 27 is chosen as a function of the desired breakdown voltage for the material in the layer 27 and the desired electrical resistance for the same material. According to one embodiment, the percentage of nitrogen is between 25% and 35%. The layer 27 presents a thickness e3 chosen, for example, so that the breakdown voltage is sufficiently low without the breakdown voltage having significant variability. The thickness e3 of layer 27 is then, for example, between 2 nm and 30 nm, and in some examples, between 3 nm and 25 nm.

During the forming step, and following the creation of the filament, a portion of the phase change material in the layer 25 is liquefied and fills the interior of the filament to form a volume 29 known as a "confined zone" or channel.

According to another embodiment, the layer 27 is a layer of a dielectric that includes a confined zone 29 formed, for example, by etching followed by filling with a phase change material, for example, the same material as layer 25.

The PCM layer 25 presents, for example, a thickness e1 between 10 nm and 200 nm and equal, for example, to about 50 nm. According to the embodiment illustrated in FIG. 3, the layer 25 and the layer 27 present, for example, a width substantially equal to the width of the electrode 23, the electrode 21 and, optionally, the heating element 24. The PCM layer 25 and GeN layer 27 present, for example, a width between 3 nm and 500 nm and equal, for example, to about 50 nm.

According to the embodiment illustrated in FIG. 3, the volume 31 is located opposite volume 29. The surface area of the base of the dome 31 is slightly larger than the surface area of the upper face of the volume 29.

An advantage that becomes apparent from the presence of a germanium nitride layer between the phase memory material layer and the lower electrode is that germanium nitride has a high physicochemical compatibility.

Figure 4:
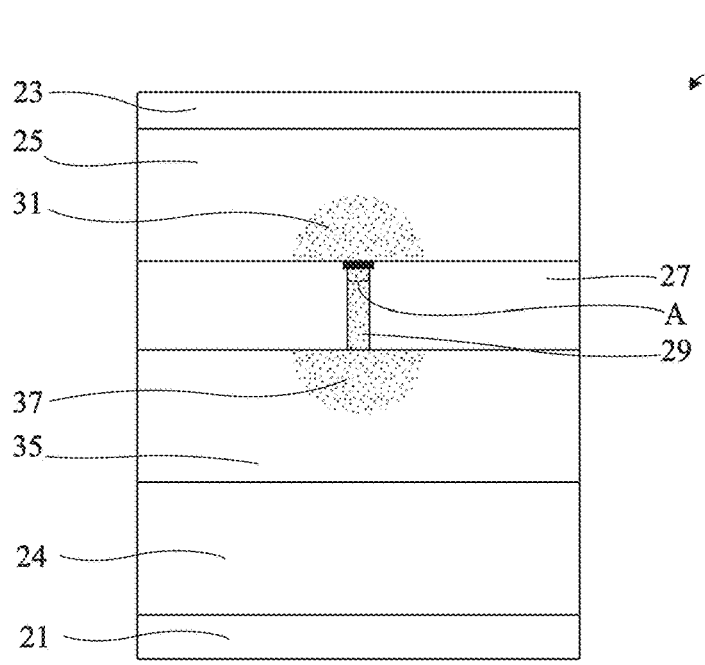
FIG. 4 represents, in a partial, schematic cross-sectional view, yet another embodiment of a phase change device.

FIG. 4 is a partial, schematic cross-sectional view of an alternative embodiment of the device 3 illustrated in FIG. 3.

More particularly, FIG. 4 illustrates a device 4 similar to the device 3 illustrated in FIG. 3 except that it includes a layer 35 between the layer 27 and the heating element 24.

According to the embodiment illustrated in FIG. 4, the layer 35 is composed of a phase change material, for example, of the same nature as the layer 25.

According to the embodiment illustrated in FIG. 4, a volume 37 of the layer 35 is also involved in switching between the resistive and low resistive phases. The volume 37 presents the shape of an inverted dome, i.e. its base is at the interface between the layer 27 and layer 35.

The device 4 thus comprises, during the temperature increase, two domes, head-to-tail, i.e. their flat faces, or bases, are facing each other.

To perform the RESET operation, the dome or volume 31 illustrated in FIGS. 2 to 4 is switched to a resistive state and to perform the SET operation, the dome or volume 31 is switched to a low-resistive state.

Each of the SET and RESET operations, if it follows a previous RESET operation, comprises for example a first so-called electronic transition during which a relatively long (a few nanoseconds) and low intensity (but with a voltage higher than the threshold voltage) electrical pulse is applied across the electrodes 21 and 23. The object of this first transition is to switch the volume 31 from a resistive state to a conductive state, also called "threshold" transition, the conductive state allowing the current to pass and then the heating to take place.

Subsequently, a second transition, so-called "phase" is implemented either as part of a SET operation, during which the phase change material switches from a resistive state to a less resistive state, or as part of a RESET operation, where the phase change material switches from a less resistive state to a resistive state According to one embodiment, the evolution of the current density $J_0(t)$ propagated in devices 2, 3 and 4 as a function of time in order to switch the volume 31 into a less resistive state (SET operation) comprises:

- a step of increasing the current density as a function of time in order to make the material of volume 31 conductive; and
- a step of monotonically decreasing the current density as a function of time to switch the material of the volume 31 to a less resistive state.

If, during the second time, the rate is not slow enough, the volume 31 returns to a resistive state.

The current applied between the two electrodes 21 and 23 and the surface current density are related by the formula:

$$I_{prog} = A \cdot J_{prog} \qquad \text{[Math 1]}$$

where $I_{prog}$ is the programming current 27 applied between electrodes 21 and 23, $J_{prog}$ is the programming current density, and A is the area mentioned above and A is an area defined as:

- the area of the contact zone between the volume 31 and the heating element 24 or
- electrode 21 in the case of the device 2; or
- the area of the smallest section of the channel 29 of the layer 27 in the case of the devices 3 and 4.

An advantage that arises from the presence of a layer comprising a filament between the layer of phase change memory material and the lower electrode is that the area A is reduced. The same current density can thus be achieved with a lower programming current.

An advantage that arises with the presence of layer 35 between the layer 27 and the heating element 24 is that the heat loss from the interface between layer 27 and element 24 is reduced due to the relatively low thermal conductivity of the layer 35 material, thus thermal insulation is increased.

Figure 5:
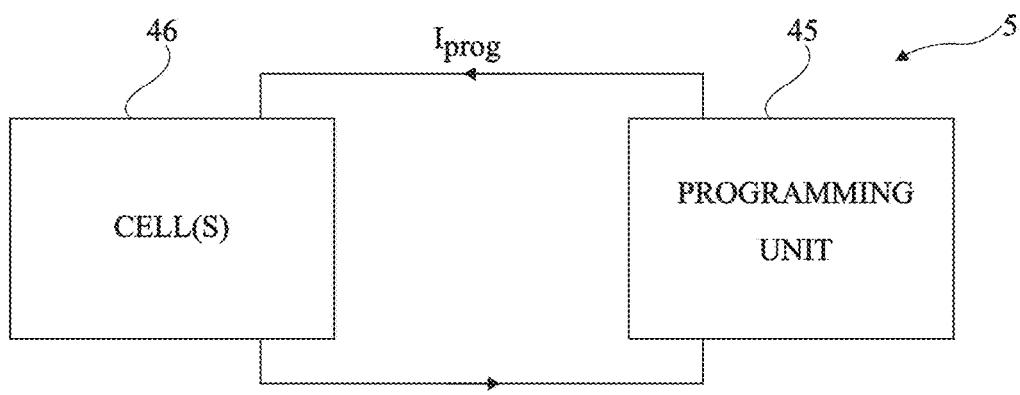
FIG. 5 is a block diagram illustrating a phase change memory system.

FIG. 5 is a block diagram illustrating a phase change memory circuit 5 comprising a portion dedicated to phase change memories and a portion dedicated to programming the same.

More particularly, the system 5 includes a PROGRAMMING UNIT 45 and an array 46 of one or more phase change memory CELL(S). Each cell in the array 46 comprises a device as illustrated in FIGS. 1 to 4. The devices are, for example, electrically shunted relative to each other.

According to the embodiment illustrated in FIG. 5, the programming unit 45 generates a current $I_{prog}$ that flows through each cell of the array 46. Within each cell, the device is traversed by a surface current density $J_{prog}$, corresponding to the current $I_{prog}$ divided by the area A.

According to one embodiment, the evolution of the current density propagated in the device as a function of time in order to totally or partially switch the volume 31 from a resistive state to a less resistive state (SET operation) comprises:

- a step of increasing the current density as a function of time to make the material of the volume 31 conductive; and
- a step of nonlinearly decreasing the current density as a function of time in order to make the material of the volume 31 less resistive, this step being described in more detail, hereinafter, in relation to FIGS. 6 to 12.

As an example, the nonlinear decrease in the current density as a function of time is controlled by a digital to analog converter forming part of the programming unit 45. In particular, the shape of the decay is, for example, defined by a sequence of digital values, which are subsequently converted into an analog control signal by this converter.

Figure 6:
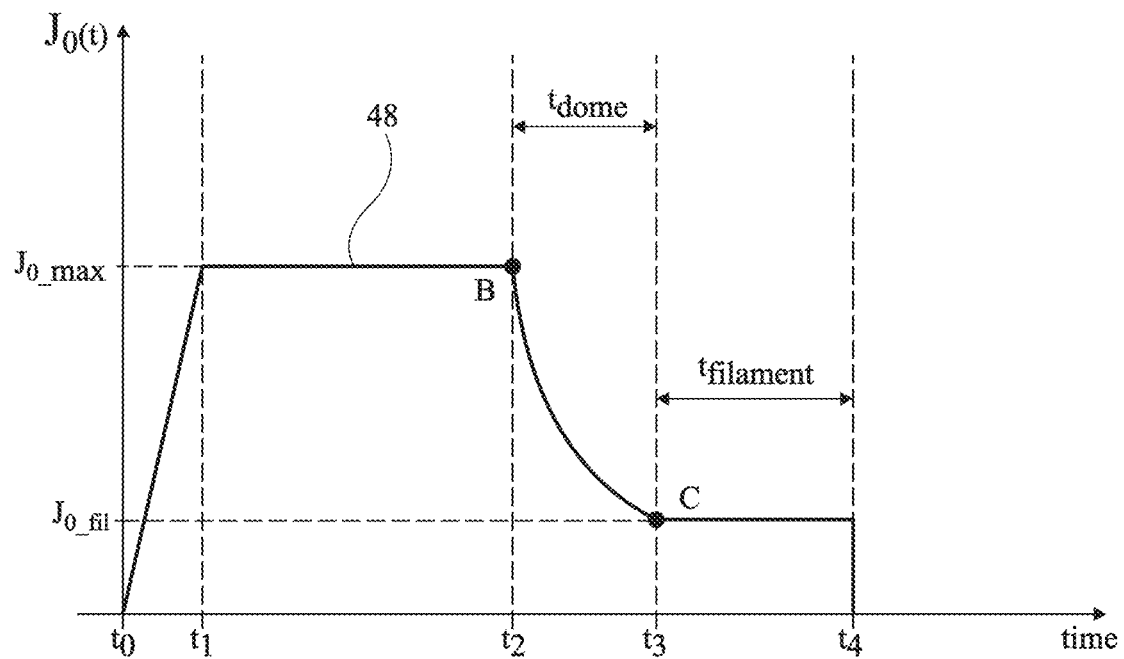
FIG. 6 is a graph representing an example of the evolution of the current density propagated in the device illustrated in FIG. 3 as a function of time in order to switch a portion of the materials in this device from a resistive state to a less resistive state.

FIG. 6 represents one embodiment of the evolution of the current density propagated in the device 3 illustrated in FIG. 3 as a function of time in order to switch a portion of the phase change material of this device from a resistive state to a less resistive state. This embodiment applies to devices similar to the device 3 in FIG. 3 comprising a confined zone, i.e., a channel with a width much smaller than the width of the layer 25.

More particularly, FIG. 6 represents a curve 48 illustrating the evolution of the surface current density $J_0(t)$ in the channel 29, imposed by a current $I(t)$ passing through the electrodes as a function of time (time).

According to the embodiment illustrated in FIG. 6, the curve 48 comprises:

- a first portion of linear growth of the current density (second evolution) between a time instant $t_0$ and a time instant $t_1$;
- a second portion of substantially constant current density (third evolution), at the level $J_{0\_max}$ between the time instant $t_1$ and a time instant $t_2$;
- a third portion of nonlinear decrease of the current density (first evolution) between the time instant $t_2$ and a time instant $t_3$, the duration between the instants $t_2$ and $t_3$ being named $t_{dome}$; and
- a fourth portion of substantially constant current density (fourth evolution), at the level $J_{0\_fil}$, between the time instant $t_3$ and a time instant $t_4$, the duration between the time instants $t_3$ and $t_4$ being named $t_{filament}$.

Figure 7:
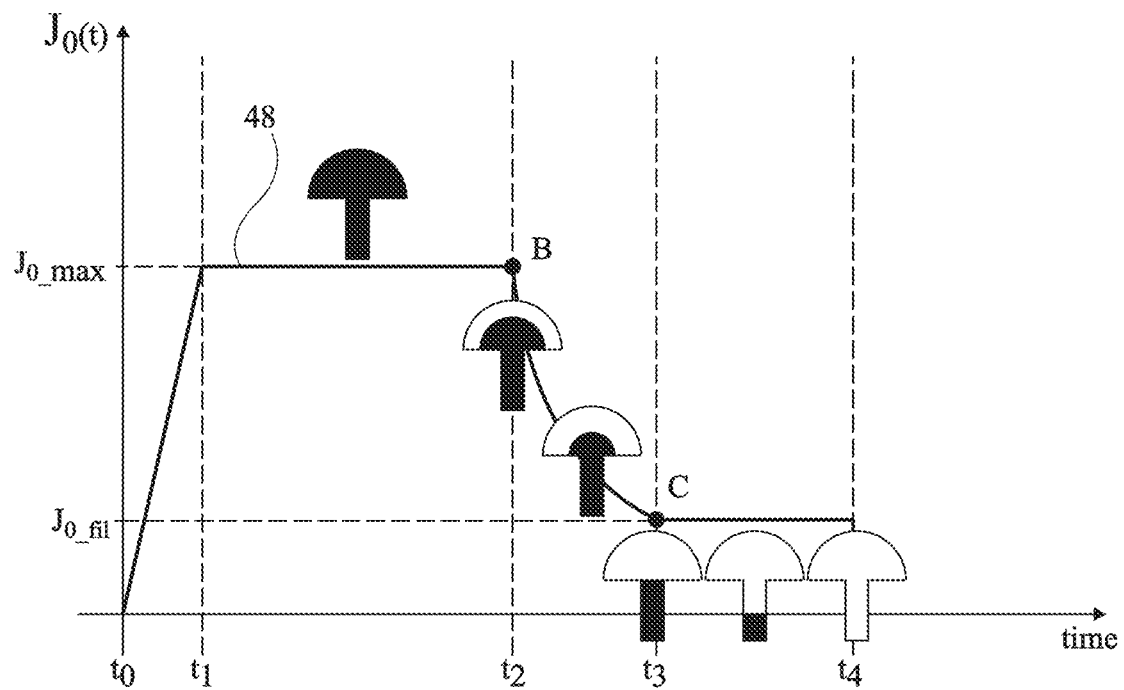
FIG. 7 is a graph representing an example of the evolution of the current density propagated in the device illustrated in FIG. 3 as a function of time in order to switch a part of the materials of this device from a resistive state to a less resistive state.

FIG. 7 represents the same curve 48 as FIG. 6 and further shows the structural evolution of the change of state of volumes 31 and 29 of the phase change material.

At time instant $t_0$, the phase change material in volume 31 is resistive and the current density is, for example, at a level 0. Between times $t_0$ and $t_1$, the current density increases so as to reach, at time instant $t_1$, a value in current density $J_{0\_max}$ that will remain substantially constant until time instant $t_2$ (point B). Between the time instants $t_0$ and $t_2$, the phase change material of volume 31 becomes conductive.

Between time instant $t_2$ and time instant $t_3$, for the duration $t_{dome}$, the phase change material of volume 31, in particular the dome corresponding to volume 31, switches to a less resistive state. The change of state of volume 31 occurs from the outside of volume 31 to the inside of volume 31, i.e., from the domed side of the dome to the flat side of the dome.

During the duration $t_{dome}$, the curve 48 decreases, i.e., the current density decreases as a function of time. To satisfy a total change of state of volume 31, the crystallization growth rate, for a volume with the shape of a dome, follows the formula:

$$\frac{\partial J_0(t)}{\partial t} < \frac{v_g}{2h \cdot (T_{melt} - T_h)} \frac{[\delta(J_0(t))^2 - T_h]^2}{\delta J_0(t)} \qquad \text{[Math 2]}$$

where: $v_g$ is the crystallization rate of the phase change material, h is the height of the phase change material layer, $T_{melt}$ is the melting temperature of the phase change material, and $T_h$ is the temperature at the interface between the second electrode and the phase change material layer and $\delta$ follows the formula:

$$\delta = R_{th} \cdot A^2 \cdot R_h \qquad \text{[Math 3]}$$

where $R_{th}$ is the thermal resistance of the device and $R_h$ is the electrical resistance of the dome material 29.

Thus, if $\delta(J_0(t))^2 \gg T_h$, the formula [Math 2] can be simplified to give:

$$\frac{\partial J_0(t)}{\partial t} < \frac{v_g \delta(J_0(t))^3}{2h \cdot (T_{melt} - T_h)} \quad [\text{Math 4}]$$

$$-\frac{H}{2}(J_0(t))^3 < \frac{\partial J_0(t)}{\partial t} < 0 \quad [\text{Math 5}]$$

$$H = \frac{v_g \cdot R_{th} \cdot A^2 \cdot R_h}{h \cdot (T_{melt} - T_h)}. \quad [\text{Math 6}]$$

As an example, the solution to the formula [Math 5] corresponds to:

$$J_0(t) = K \frac{1}{\sqrt{t}} \quad [\text{Math 7}]$$

where K is a constant and is the directing coefficient of the curve. In some embodiments, the constant K is equal to:

$$K = \frac{1}{\sqrt{H}} \text{ hence} \quad [\text{Math 8}]$$

$$J_0(t) = \frac{1}{\sqrt{Ht}}. \quad [\text{Math 9}]$$

The switching to a less resistive state is complete, for example, when, the formula is verified:

$$J_0(t) = \sqrt{\frac{T_{melt}}{R_{th} \cdot A^2 \cdot R_h}}. \quad [\text{Math 10}]$$

Thus, $t_{dome}$ verifies the equation:

$$t_{dome} = \frac{h.(T_{melt} - T_h)}{v_g \cdot T_{melt}}. \quad [\text{Math 11}]$$

Thus $t_{dome}$ is optimized for each phase change material. As an example, the duration $t_{dome}$ is between 1 ns and 1 μs.

Between time instants $t_3$ and $t_4$, during the duration $t_{filament}$, the phase change material of the dome 29, i.e., the material inside the filament, switches to a less resistive state. The change in state of the dome 29 occurs, for example, from the upper side of the layer 27, i.e., from the interface between the layer 27 and the layer 25 to the lower side of the layer 27, i.e., to the interface between the layer 27 and the element 24.

During the duration $t_{filament}$, according to the embodiment represented in FIGS. 6 and 7, the curve 48 is constant, and for example at the level $J_{0\_fil}$. The duration $t_{filament}$ depends on the height $h_{filament}$ of the layer 27 and thus the filament and corresponds to:

$$t_{filament} = \frac{h_{filament}}{v_g}. \quad [\text{Math 12}]$$

At time instant $t_4$, switching the phase change material in volumes 29 and 31 to a low-resistive state is complete and the current density decreases. The device is thus ready for a new writing cycle.

As an example, the duration $t_{filament}$ is between 1 ns and 10 μs for a filament with a height between 5 nm and 30 nm.

In the context of a device comprising a layer 35 and a double dome as illustrated in the device 4 represented in FIG. 4, the volume 37 switches to a less resistive state between the time instants $t_2$ and $t_3$.

An advantage of following the evolution of the current density as a function of time as described above is that it allows to optimize the crystallization of the active zone of the device, i.e., it allows to completely crystallize the active zones in a reduced time and using a reduced current compared to existing techniques. An advantage of following the evolution of the current density as a function of time as described above is that it allows controlling the crystallization of the volumes of the phase change material so that it is complete in the considered volumes.

The graph illustrated in FIGS. 6 and 7 has been described and explained considering a germanium nitride layer 27 in which a filament has been formed, however this evolution is also adaptable to a device comprising a dielectric layer 27 in which a PCM channel has been formed by etching.

Figure 8:
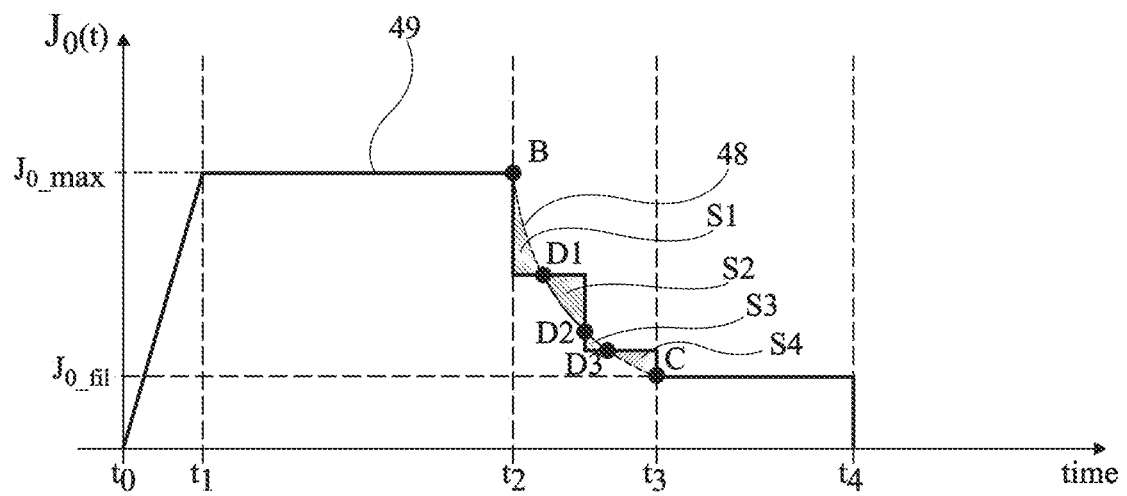
FIG. 8 is a graph representing an example of the evolution of the current density propagated in the device illustrated in FIG. 3 as a function of time in order to switch a part of the materials of this device from a resistive state to a less resistive state.
Figure 9:
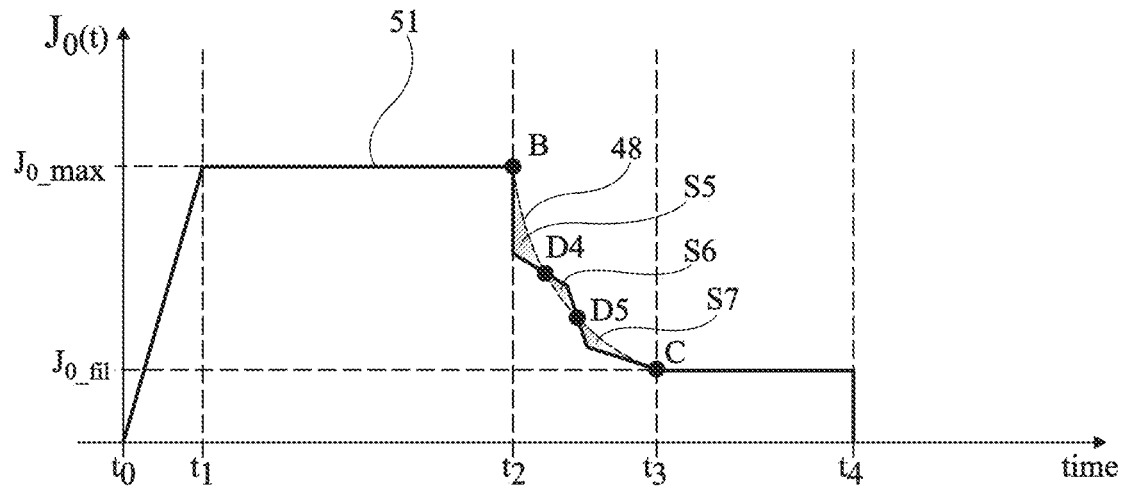
FIG. 9 is a graph representing an example of the evolution of the current density propagated in the device illustrated in FIG. 3 as a function of time in order to switch a part of the materials of this device from a resistive state to a less resistive state.
Figure 10:
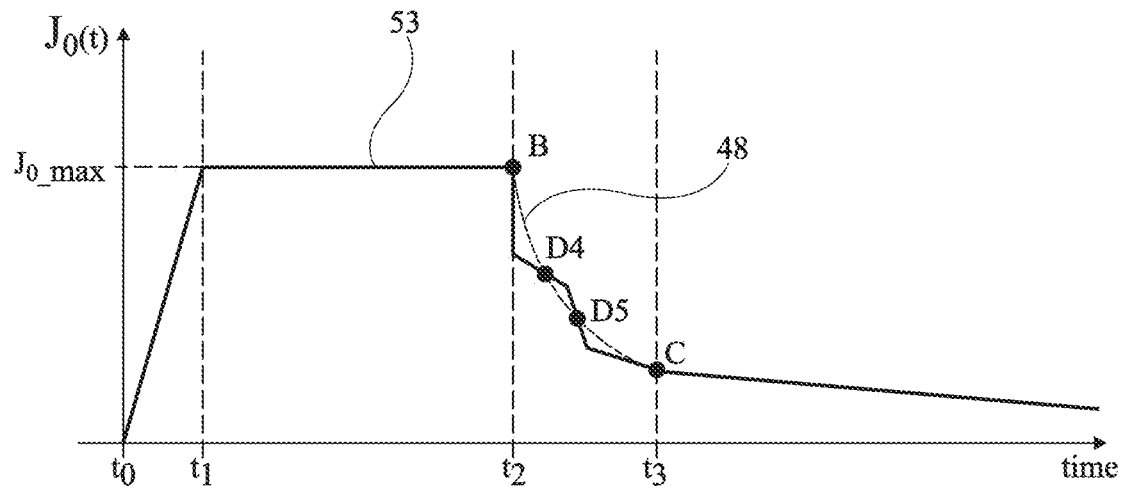
FIG. 10 is a graph representing an example of the evolution of the current density propagated in the device illustrated in FIG. 3 as a function of time in order to switch a part of the materials of this device from a resistive state to a less resistive state.

FIGS. 8 to 10 represent alternative embodiments of the evolution of the current density propagated in the devices 3 and 4 illustrated in FIGS. 3 and 4 as a function of time to switch a portion of the phase change materials in these devices from a resistive state to a low resistive state.

More specifically, FIG. 8 represents a curve 49 illustrating one embodiment of the evolution of current density as a function of time similar to that illustrated in FIGS. 6 and 7 except that the curve 49 represented in FIG. 10 is different from, but close to, the curve 48 between the times $t_2$ and $t_3$.

The example in FIG. 8 is based on a staircase-like decay. Such a shape is, for example, simple to realize by a digital to analog converter as described in connection with FIG. 5.

According to the embodiment illustrated in FIG. 8, the curve 49 passes through the points B and C respectively at the times $t_2$ and $t_3$. In FIG. 8, between the time instants $t_2$ and $t_3$, the curve 49 is segmented into decreasing slots. In other words, between the time instants $t_2$ and $t_3$, the curve 49 corresponds, for example, to a succession of constant portions and portions of increasingly lower current density levels. In FIG. 8, the curve 49 intersects the curve 48, between the points B and C, three times at points D1, D2 and D3. According to the embodiment, the curve 49 intersects, between the time instants $t_2$ and $t_3$, the curve 48 by forming surfaces between these two curves. In FIG. 8, between the curves 48 and 49, there is a surface S1 between the points B and D1, a surface S2 between the points D1 and D2, a surface S3 between the points D2 and D3 and a surface S4 between the points D3 and C.

For example, each of the surfaces S1, S2, S3, and S4 presents an area less than 20% of the integral of the curve 48 between the time instants $t_2$ and $t_3$. In some cases, each of the surfaces S1, S2, S3, and S4 present an area less than 10% of the integral of the curve 48 between the times $t_2$ and $t_3$.

In FIG. 8, the curve 49 intersects the curve 48 three times between the time instants $t_2$ and $t_3$ to form four surfaces, however, in practice, the curve 49 may intersect the curve 48 once, twice, or more than twice to form two surfaces, three surfaces, or more than three surfaces between the curves 48 and 49.

Similarly, FIG. 9 represents a curve 51 illustrating one embodiment of the evolution of the current density as a function of time similar to that illustrated in FIGS. 6 and 7 except that the curve 51 represented in FIG. 9 is different from the curve 48 between the time instants $t_2$ and $t_3$.

Figure 11:
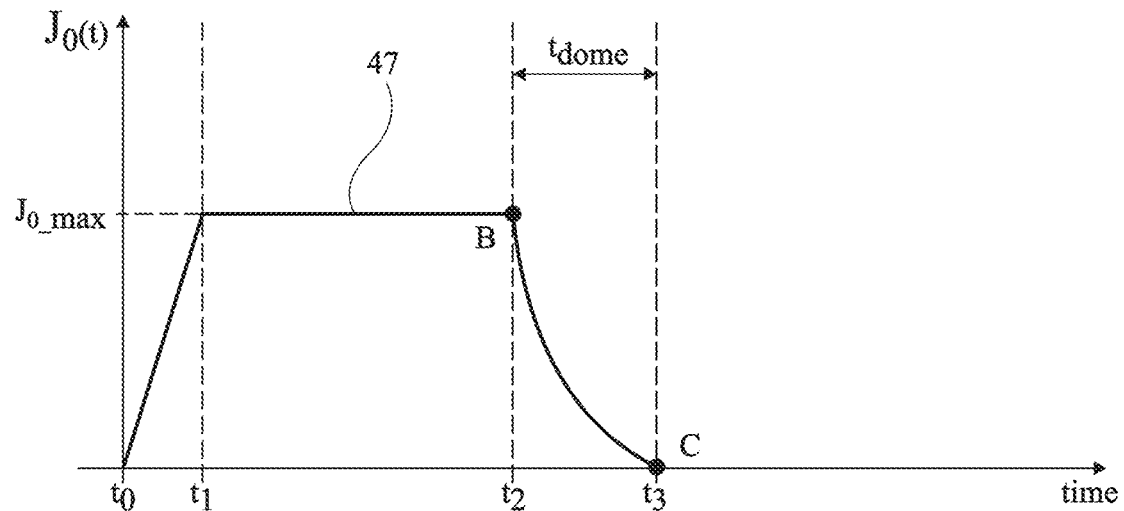
FIG. 11 is a graph representing an example of the evolution of the current density propagated in the device illustrated in FIG. 2 as a function of time in order to switch a portion of the materials in this device from a resistive state to a less resistive state.

According to the embodiment illustrated in FIG. 9, the curve 51 passes through the points B and C respectively at the time instants $t_2$ and $t_3$. In FIG. 11, between the time instants $t_2$ and $t_3$, the curve 51 is segmented into strictly decreasing portions and intersects the curve 48, between the points B and C, twice at the points D4 and D5. According to the embodiment, the curve 51 intersects, between time instants $t_2$ and $t_3$, the curve 48 by forming surfaces between these two curves. In FIG. 9, between the curves 48 and 51, there is a surface S5 between the points B and D4, a surface S6 between the points D4 and D5 and a surface S7 between the points D5 and C.

Each of the surfaces S5, S6, and S7 presents an area less than 10% of the integral of curve 48 between time instants $t_2$ and $t_3$. For example, each of the surfaces S5, S6, and S7 presents an area less than 5% of the integral of curve 48 between time instants $t_2$ and $t_3$.

In FIG. 9, the curve 51 intersects the curve 48 twice between the time instants $t_2$ and $t_3$ to form three surfaces, however, in practice, the curve 51 may intersect the curve 48 once, twice, or more than twice to form two surfaces, three surfaces, or more than three surfaces between the curves 48 and 51.

As an example, the average slope of the first evolution between B and C is close to a slope that respects the relationship $$J_0(t) = K \frac{1}{\sqrt{t}}.$$

Similarly, FIG. 10 represents a curve 53 illustrating one embodiment of the evolution of the current density as a function of time similar to the one illustrated in FIG. 9 except that the curve 53 illustrated in FIG. 10 is different from the curve 51 after the time instant $t_3$.

According to the embodiment illustrated in FIG. 10, the curve 53 is decreasing after the time instant $t_4$.

FIG. 11 represents one embodiment of the evolution of the current density $J_0(t)$ propagated in the device 2 illustrated in FIG. 2 as a function of time and more particularly, in the volume 31, in order to switch a portion of the materials of these devices from a resistive state to a low resistive state.

More particularly, FIG. 11 illustrates a curve 47 illustrating the evolution of the current density $J_0(t)$, imposed by a current I(t) passing through the electrodes as a function of time (time).

According to the embodiment illustrated in FIG. 11, the curve 47 comprises, similarly to the curve 48 illustrated in FIGS. 6 and 7:
 a first portion of linear growth of the current density between time instant $t_0$ and time instant $t_1$;
 a second portion of substantially constant current density between time instant $t_1$ and time instant $t_2$; and
 a third portion of nonlinear decay of the current density between time instant $t_2$ and time instant $t_3$.

Figure 12:
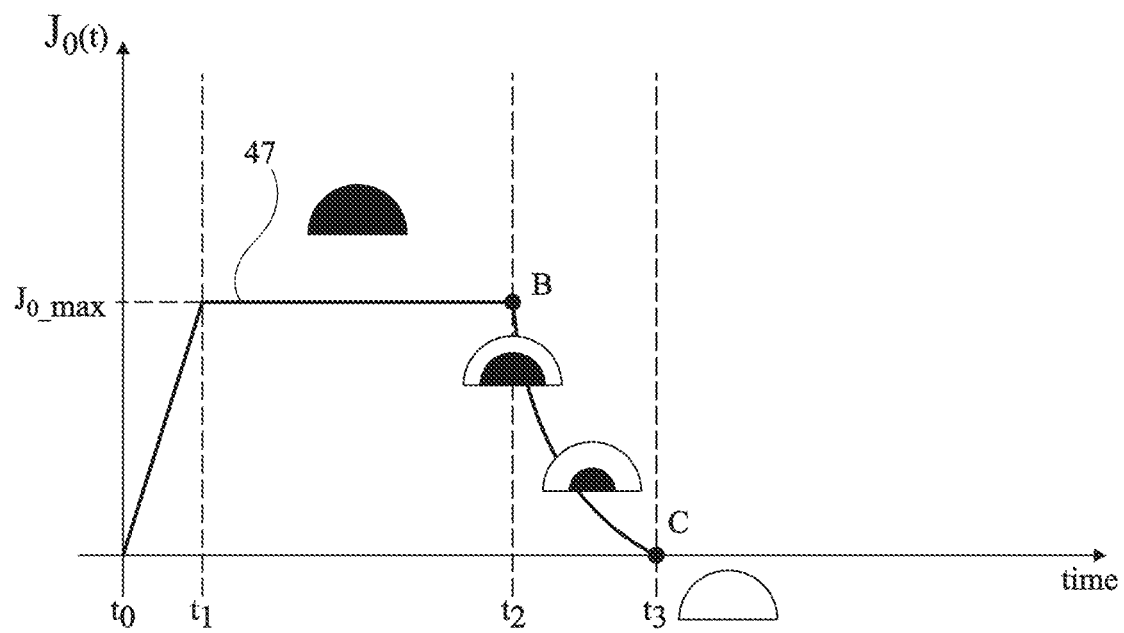
FIG. 12 is a graph representing an example embodiment of the evolution of the current density propagated in the device illustrated in FIG. 2 as a function of time to switch a portion of the materials in that device from a resistive state to a less resistive state.

FIG. 12 represents the same curve 47 as FIG. 11 and further shows the structural evolution of the change of state in the volume 31 of the phase change material.

Similar to the curve 48, during the duration $t_{dome}$, the curve 47 decreases, i.e., the current density decreases as a function of time. To satisfy a good crystallization of volume 31, the current density verifies for example the formula:

$$J_0(t) = K \frac{1}{\sqrt{t}} \quad \text{[Math 7]}$$

in which:

$$K = \frac{1}{\sqrt{H'}} \quad \text{with:} \quad \text{[Math 13]}$$

$$H = \frac{v_g \cdot R_{th} \cdot A^2 \cdot R'_h}{h \cdot (T_{melt} - T_h)}$$

with Rh' is the resistance of the heating element 24.
Thus, $t_{dome}$ verifies the equation:

$$t_{dome} = \frac{h \cdot (T_{melt} - T_h)}{v_g \cdot T_{melt}}. \quad \text{[Math 14]}$$

As an example, the duration $t_{dome}$ is between 1 ns and 1 μs.

At the time instant $t_3$, all of the phase change material present in the volume 31 switches to a low resistive state. The device is thus ready for a new write cycle.

One advantage of the described embodiments and modes of implementation is that they are compatible with the usual production lines for microelectronic components.

Various embodiments and variants have been described. Those skilled in the art will understand that certain features of these embodiments can be combined and other variants will readily occur to those skilled in the art. In particular, the variants of the curve 48 illustrated in FIGS. 8 to 10 may be applicable to the evolution of the curve 47 represented in FIGS. 11 and 12.

Finally, the practical implementation of the embodiments and variants described herein is within the capabilities of those skilled in the art based on the functional description provided hereinabove.

The invention claimed is:

1. A method of programming a phase change memory comprising a first layer of a phase change material capable of switching between a crystalline and an amorphous state and vice versa, the method comprising the application of a programming current through the first layer such that an evolution of the areal current density as a function of time t decreases from a first level, between a first time instant and a second time instant, following a first evolution in time respecting, or being close to, $$J_0(t) = \frac{K}{\sqrt{t}}$$

where K is a constant.

2. The method according to claim 1, wherein the first evolution is close to $$J_0(t) = \frac{K}{\sqrt{t}}$$

if it creates, when superimposed thereon, one or more surfaces between the first evolution and $$J_0(t) = \frac{K}{\sqrt{t}},$$

and the ratio or the area of each surface to the integral of $$J_0(t) = \frac{K}{\sqrt{t}}$$

between the first and the second time instants is less than 0.2.

3. The method according to claim 1, wherein the first evolution intersects $$J_0(t) = \frac{K}{\sqrt{t}}$$

at least at two points between the first and second time instants.

4. The method according to claim 1, wherein, prior to the first time instant the evolution of the areal current density as a function of time t, follows a second linear increasing evolution between a third time instant and a fourth time instant then a third constant evolution equal to the first level between the fourth time instant and the first time instant.

5. The method according to claim 1, wherein the first evolution comprises several strictly decreasing linear portions and/or constant proportions, between the first time instant and the second time instant.

6. The method according to claim 1, wherein the first layer rests on a heating element or on an electrode.

7. The method according to claim 1, wherein the first layer rests on a second germanium nitride based layer.

8. The method according to claim 7, wherein the programming current is applied through the first layer and a channel in the second layer, a contact zone between the channel and the lower face of the first layer having a smaller area than the lower face of the first layer.

9. The method according to claim 8, wherein the channel is a confined zone of a phase change material and is located in a filament of the second layer, the method comprising, after the second time instant, a step of crystallizing the confined zone.

10. The method according to claim 9, wherein a crystallization of the confined zone is brought about by a fourth constant linear evolution of the current density as a function of time, over a first duration ($t_{filament}$) and wherein the first duration is equal to $$t_{filament} = \frac{h_{filament}}{v_g}$$

with $h_{filament}$ the average height of the confined zone and with $v_g$ the crystallization velocity of the phase change material.

11. The method according to claim 9, wherein the crystallization of the confined zone is brought about by a strictly decreasing linear evolution of the current density with time.

12. The method according to claim 9, wherein $$K = \frac{1}{\sqrt{H}} \text{ where } H = \frac{v_g . R_{th} . A^2 . R_h}{h.(T_{melt} - T_h)}$$

with $R_{th}$ the thermal resistance of the cell, $R_h$ the electrical resistance of the phase change material in the filament, A the area of the contact zone between the filament and the lower face of the first layer, h the maximum height of the phase change material, $T_{melt}$ the melting temperature of the phase change material, and with $T_h$ the temperature of the first layer at its upper face, i.e., at the side opposite the lower face.

13. The method of claim 6, wherein $$K = \frac{1}{\sqrt{H'}} \text{ where } H' = \frac{v_g . R_{th} . A^2 . R'_h}{h.(T_{melt} - T_h)}$$

with $R_{th}$ the thermal resistance of the cell, $R_h'$ the electrical resistance of the heating element, A the area of the contact zone between the electrode or heating element and the lower face of the first layer, h the maximum height of the phase change material, $T_{melt}$ the melting temperature of the phase change material, and with $T_h$ the temperature of the first layer at its upper face, i.e., at the face opposite the lower face.

14. The method according to claim 6, wherein the duration between the first and second time instants, is equal to a second duration $$t_{d\hat{o}me} = \frac{h.(T_{melt} - T_h)}{v_g . T_{melt}}.$$

15. The method according to claim 1, wherein the duration ($t_{d\hat{o}me}$) between the first and second time instants is between 1 ns and 1 μs.

16. The method according to claim 1, wherein the first level is a maximum current density level that the cell reaches during the programming cycles.

17. The method according to claim 1, wherein the application of the programming current corresponds to a crystallization of a portion of the first layer.

* * * * *

UNITED STATES PATENT AND TRADEMARK OFFICE
CERTIFICATE OF CORRECTION

PATENT NO. : 11,800,820 B2
APPLICATION NO. : 17/531896
DATED : October 24, 2023
INVENTOR(S) : Gabriele Navarro et al.

Page 1 of 1

It is certified that error appears in the above-identified patent and that said Letters Patent is hereby corrected as shown below:

In the Claims

At Column 13, Claim 2, Line 5:
"and the ratio or the"
Should read:
--and the ratio of the--

At Column 14, Claim 13, Line 26:
" $K = \frac{1}{\sqrt{H'}}$ where $H' = \frac{v_g . R_{th} . A^2 . R'_h}{h.(T_{melt} - T_h)}$ "
Should read:
-- $K = \frac{1}{\sqrt{H'}}$ where $H' = \frac{v_g . R_{th} . A^2 . R_h'}{h.(T_{melt} - T_h)}$ --

Signed and Sealed this
Ninth Day of January, 2024

Katherine Kelly Vidal
*Director of the United States Patent and Trademark Office*